US008026516B2

(12) United States Patent
An et al.

(10) Patent No.: US 8,026,516 B2

(45) Date of Patent: Sep. 27, 2011

(54) CARRIER MODULE FOR USE IN A HANDLER AND HANDLER FOR HANDLING PACKAGED CHIPS FOR A TEST USING THE CARRIER MODULES

(75) Inventors: Jung Ug An, Cheonan-si (KR); Hee Rak Beom, Seoul (KR); Dae Gon Yun, Gumi-si (KR)

(73) Assignee: Mirae Corporation, Cheonan-si (KR)

( * ) Notice: Subject to any disclaimer, the term of this patent is extended or adjusted under 35 U.S.C. 154(b) by 39 days.

(21) Appl. No.: 11/987,186

(22) Filed: Nov. 28, 2007

(65) Prior Publication Data

US 2008/0121561 A1 May 29, 2008

(30) Foreign Application Priority Data

Nov. 29, 2006 (KR) ........................ 10-2006-0118887

(51) Int. Cl.
*H05K 7/02* (2006.01)

(52) U.S. Cl. ..... 257/48; 269/903; 206/725; 324/755.01; 312/216; 414/935

(58) Field of Classification Search .................. 206/725, 206/477, 480, 561, 562, 559, 564, 565; 312/216; 257/48; 324/755, 754, 755.01, 756.01, 756.02; 220/243–251; 414/935; 269/289 R, 291, 903

See application file for complete search history.

(56) References Cited

U.S. PATENT DOCUMENTS

| | | | | |
|---|---|---|---|---|
| 2,967,080 | A * | 1/1961 | Nelson | 312/216 |
| 4,632,446 | A * | 12/1986 | Douglass | 296/37.6 |
| 5,223,785 | A * | 6/1993 | Becker | 324/756.02 |
| 5,493,237 | A * | 2/1996 | Volz et al. | 324/754 |
| 5,546,277 | A * | 8/1996 | Zandbergen | 361/726 |
| 5,990,692 | A * | 11/1999 | Jeong et al. | 324/755 |
| 6,262,581 | B1 * | 7/2001 | Han | 324/755 |
| 6,375,408 | B1 * | 4/2002 | Carter | 206/725 |
| 6,630,836 | B2 * | 10/2003 | Farnworth et al. | 324/755 |
| 6,677,770 | B2 * | 1/2004 | Frankowsky | 324/755 |
| 6,831,296 | B1 * | 12/2004 | Lee et al. | 324/755 |
| 2008/0124202 | A1 * | 5/2008 | Chu et al. | 414/331.03 |

* cited by examiner

*Primary Examiner* — J. Gregory Pickett
*Assistant Examiner* — Andrew Perreault
(74) *Attorney, Agent, or Firm* — KED & Associates LLP

(57) ABSTRACT

Provided is a carrier module for use in a handler for handling a packaged chip for a test, the carrier module including a body provided, a base plate where the packaged chips are placed, provided to the body, and at least one latch which holds the packaged chips in position in the base plate.

21 Claims, 7 Drawing Sheets

CARRIER MODULE FOR USE IN A HANDLER AND HANDLER FOR HANDLING PACKAGED CHIPS FOR A TEST USING THE CARRIER MODULES

BACKGROUND OF THE INVENTION

1. Field of the Invention

The present invention relates to a carrier module in which a plurality of packaged chips are held firmly in position and a handler for handling a packaged chip for a test using the carrier modules.

2. Description of the Background Art

At the conclusion of a packaging process, a handler puts packaged chips through a series of environmental, electrical, and reliability tests. These tests vary in type and specifications, depending on the customer and use of the packaged devices. The tests may be performed on all of the packages in a lot or on selected samples.

The handler puts packaged chips into a test tray and supplies the test tray to a tester. The tester includes a test board with a plurality of sockets, performing an electrical test on the packaged chips. The packaged chips are inserted into the sockets of the test board for the electrical test. The handler puts the packaged chips into a test tray, i.e. a jig and connecting the packaged chips contained in a test tray into sockets of the test board. The handler sorts the packaged chips according to a test result. The handler removes packaged chips from a user tray and put the removed packaged chips into carrier modules of the test tray. The handler transfers the test tray to the tester. The handler removes tested packaged chips from the carriers of the test tray and places the tested packaged chips to a user tray.

The test tray is equipped with the carrier modules in which the packaged chips are placed. A distance between the packaged chips in the carrier modules is the same as that between the sockets of the test board.

Referring to FIGS. 1 and 2, a conventional carrier module and a conventional test tray equipped with the conventional carrier modules are described.

FIG. 1 is a perspective view illustrating how the carrier module 6 is provided to the test tray 1. The test tray 1 includes a rectangular frame 2, and a plurality of supporting bars 3 spaced and arranged relative to each other, connected to the rectangular frame 2 on the inside.

Supporting pads 4 are provided to the supporting bars 3. The carrier module 6 is connected to the supporting pads 4. The number of the supporting pads 4 determines the number of the carrier modules to be provided to the test tray. The distance between the supporting pads determines the distance of the carrier modules. One packaged chip is placed in one carrier module.

As shown in FIG. 2, the packaged chip is placed in a cavity 13 of the carrier module 11. A latch 14, holding the packaged chip in position, is provided to each of both sides of the cavity 13.

One side of the latch 14 is connected to a button 17 which is supported by a spring 15. The fin 14*a*, which get in contact with the packaged chip, is provided to the bottom of the latch 14.

When the button 17 is pushed, a pair of the latches 14 is rotated about a pin 15. Then the fin 14*a* opens toward the outside of the cavity. At this point, the packaged chip is placed in the cavity 13. When the button stops being pushed, the fin 14*a* is moved toward the inside of the cavity 13 and is pressed against the packaged chip, thus resulting in holding the packaged chip firmly in position.

However, one packaged chip is placed in each of the carrier modules. The carrier modules are required to be as many as the packaged chips, which are to be contained in the test tray.

Furthermore, change in a size of the packaged chip requires the existing carrier modules to be replaced with other carrier modules.

It is also difficult to shorten the distance between the packaged chips placed in the carrier modules more shorter than the distance between the carrier modules.

BRIEF DESCRIPTION OF THE INVENTION

Therefore, an object of the present invention is to provide a carrier module in which a plurality of packaged chips are held firmly in position and a handler for handling a packaged chip for a test using the carrier modules.

Another of the present invention is to provide a carrier module in which packaged chips are spaced at a minimum relative to each other and a handler for handling a packaged chip for a test using the carrier modules.

According to an aspect of the present invention, there is provided a carrier module for use in a handler for handling a packaged chip for a test, the carrier module including a body provided to a test tray, a base plate where the packaged chips are placed, provided to the body, and at least one latch which holds the packaged chips in position in the base plate.

The base plate may include a plurality of compartments on the upper surface, in each of which the packaged chip is placed.

The carrier module further includes at least one partition provided to the upper surface of the base plate to form the plurality of compartments.

A width of the partition may be the same as a distance between the packaged chips 8 which are to be placed in the compartments.

The compartments may be formed in one or more rows on the upper surface of the base plate.

One or more inside walls, intersecting the partitions, may be provided to the body to place the packaged chips in two or more rows.

The latch may include a first latch, provided to an outside wall of the body, and a second latch, provided to the inside wall of the body.

The first and second latches may cooperate to hold a row of packaged chips in position in the compartments by being pressed against the upper surfaces of the packaged chips.

The latch may include a first bar rotatably connected to the body and a second bar to be pressed against the upper surfaces of the packaged chips to hold the packaged chips in position.

The latch may include third bars protruding from the second bar in the direction of the length of the packaged chip.

The second bar may be pressed against centers of the upper surfaces of the packaged chips in the direction of the width of the packaged chip.

The latch may include a first bar rotatably connected to the body and third bars protruding from the connection part in the direction of the length of the packaged chip, which are to be pressed against the upper surfaces of the packaged chips to hold the packaged chips in position.

Two or more latch may be employed to hold a single row of the packaged chips in position.

The carrier module may include an elastic member provided between the body and the latch, providing a returning force to be applied to the upper surface of the packaged chip.

The elastic member may include a torsion spring providing the returning force toward the base plate.

A long hollow may be on the outside wall. The long hollow hole is where the latch is accommodated which is rotated by being pushed.

A contact hole may be formed on the base plate. Through the contact hole, a certain portion of the packaged chip is exposed to contact with an external device.

According to another aspect of the present invention, there is provided a handler for handling a packaged chip for a test, including a carrier module including a body, a base plate in which a plurality of the packaged chips are placed, provided to the body, and at least one latch which holds the packaged chips in position in the base plate, and a driving unit for rotating clockwise or counterclockwise the latch to move the latch into a long hollow provided on the outside wall of the body, and to return the latch back to the latch's original position.

The latch may include an elastic member for providing a returning force by which the latch is pressed against the upper surface of the packaged chip.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

Figure 1:
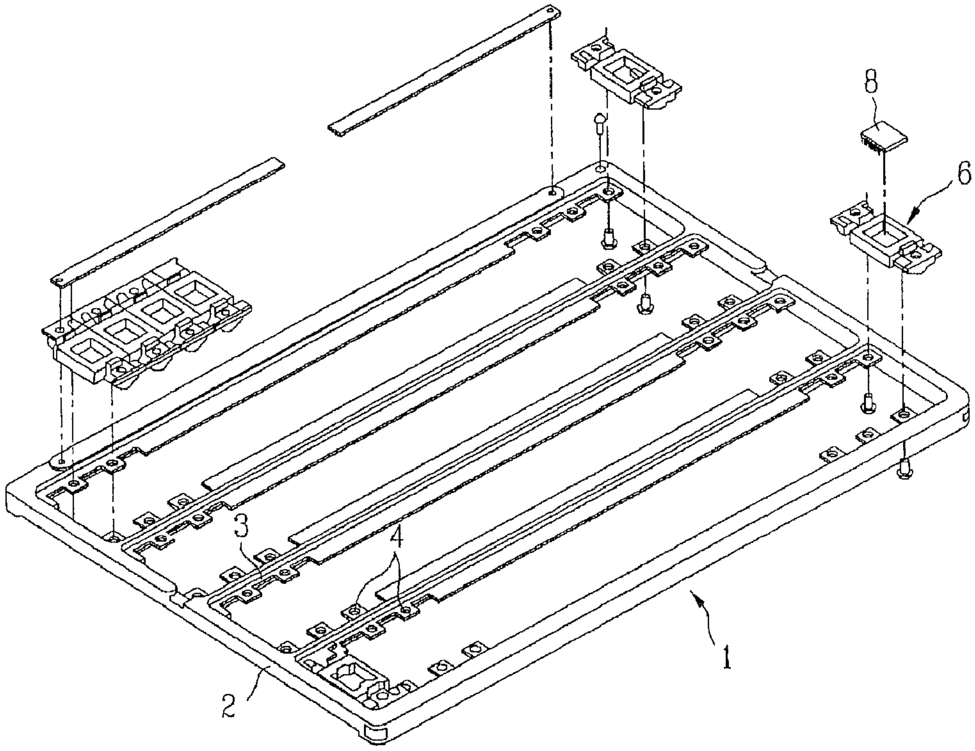
FIG. 1 RELATED ART
FIG. 1 is a perspective view illustrating how a conventional carrier module is provided to a test tray.
Figure 2:
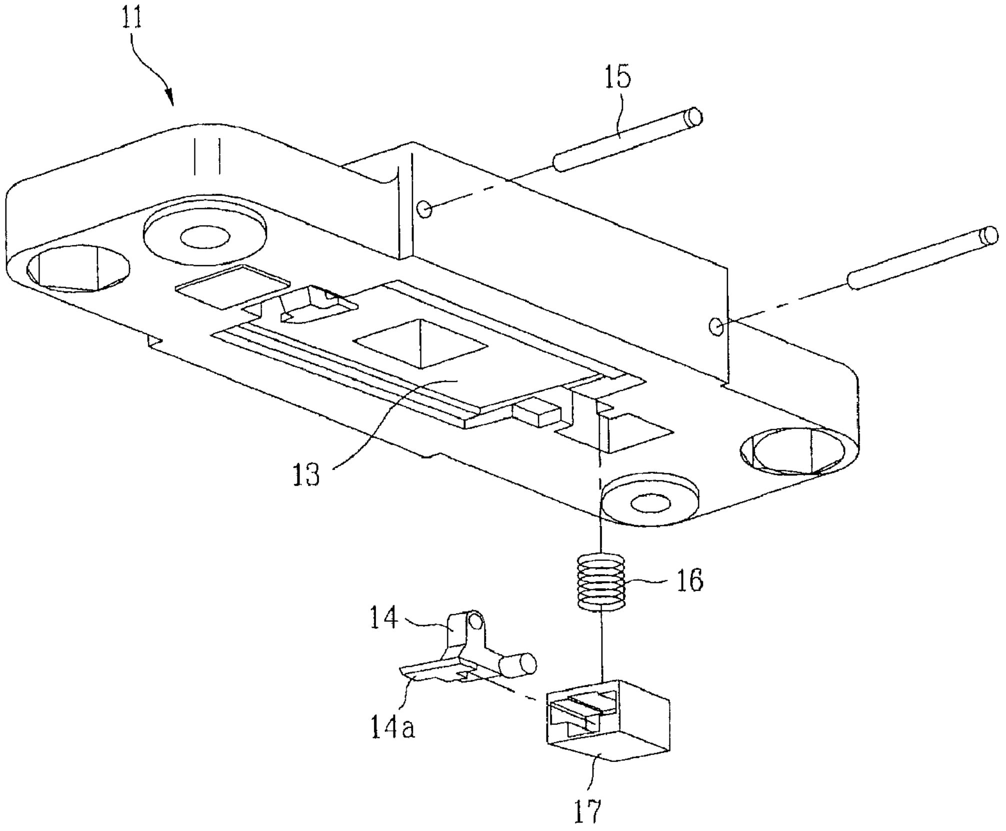
FIG. 2 RELATED ART
FIG. 2 is a perspective view illustrating a conventional a carrier module.
Figure 3:
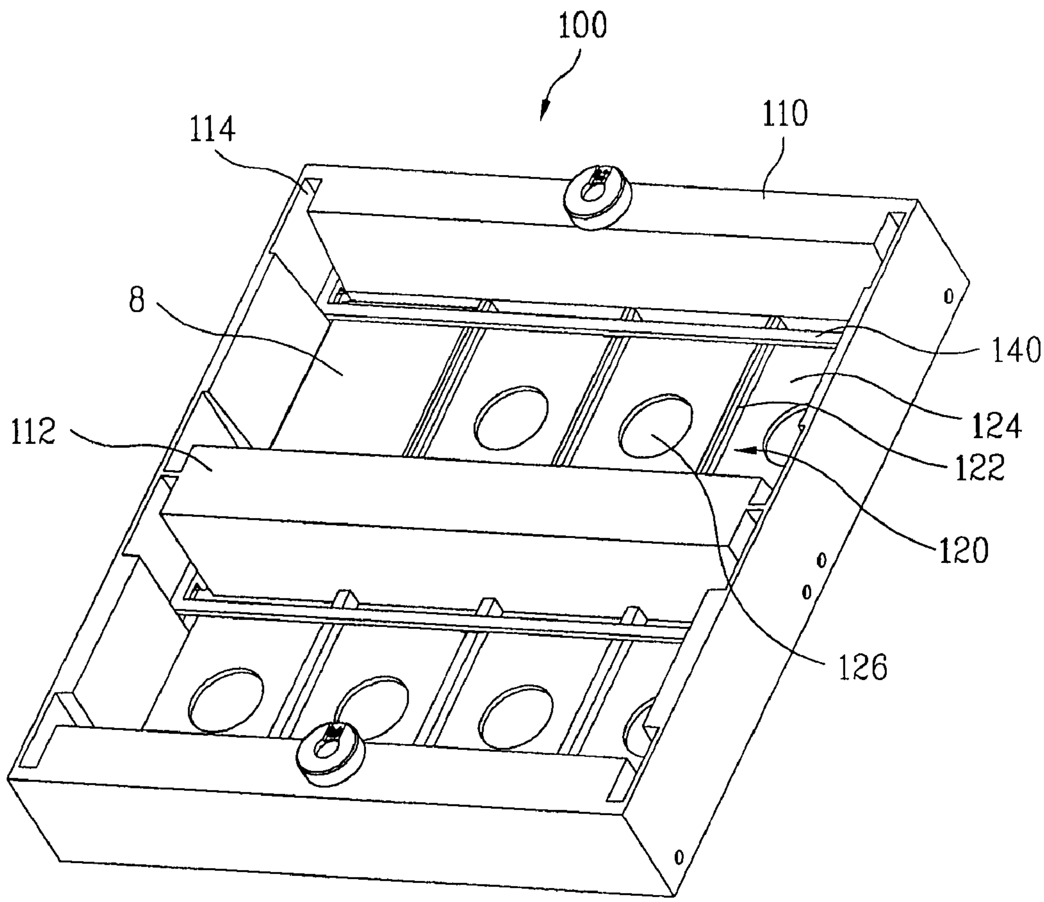
FIG. 3 is a perspective view illustrating a carrier module for use in a handler for handling a packaged chip for a test according a first embodiment of the present invention.
Figure 4:
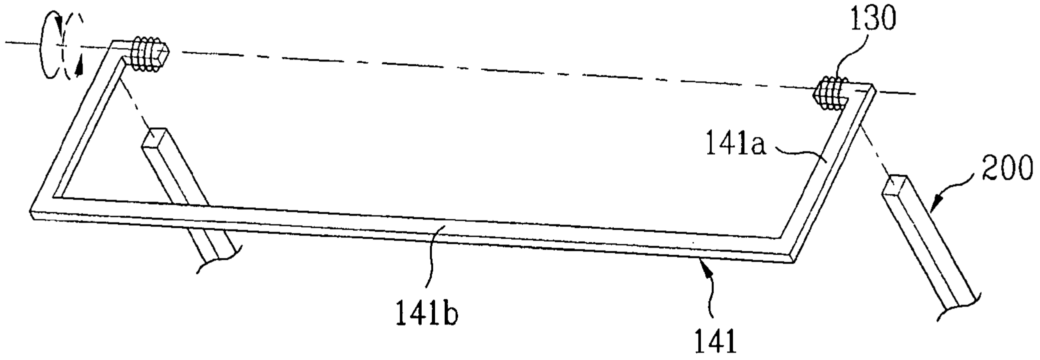
FIG. 4 is a plane view illustrating how a latch provided to the carrier module of FIG. 3 is rotated.
Figure 5:
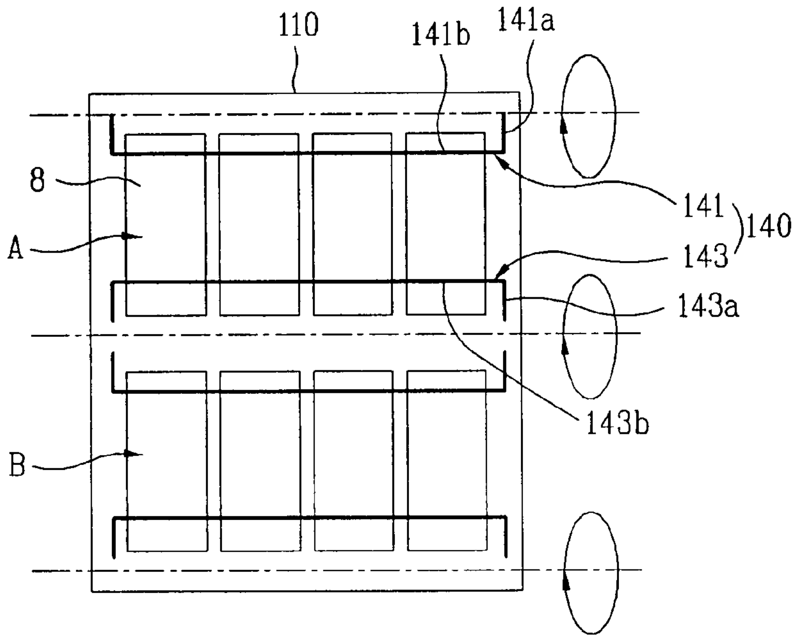
FIG. 5 is a plane view illustrating the carrier module of FIG. 3.

FIG. 3 is a perspective view illustrating a carrier module for use in a handler for handling a packaged chip for a test according a first embodiment of the present invention. FIG. 4 is a plane view illustrating how a latch provided to the carrier module of FIG. 3 is rotated. FIG. 5 is a plane view illustrating the carrier module of FIG. 3.

As shown in FIG. 3, the carrier module 100 according to the present invention includes a body 110 provided to a test tray (not shown), a base plate 120 where packaged chips are placed, and at least one latch which holds the packaged chips in position in the base plate.

The body 110 forms the outer appearance of the carrier module 100. A shape of the body 110 may be determined based on a shape of the packaged chip.

The body 110 has the shape of a rectangular prism with lower and upper openings. The base plate 120 is provided to the bottom of the body 110, closing the lower opening. The packaged chips are placed on the base plate 120 through the upper opening.

The base plate 120 has a plurality of compartments on the upper surface, in each of which the packaged chip is placed. The plurality of compartments are formed in one or more rows on the surface of the base plate 120.

The compartment 124 are regularly spaced and separated from each other by partitions 122. The partition 122 may be in the shape of a bar.

The compartment 124 is formed in the space between the partitions 122.

The compartment 124 may be formed by making a hollow on the upper surface of the base plate 120. The partition 124 prevents the packaged chip 8 from sliding in the compartment 124.

A width of the partition 122 is the same as a distance between the packaged chips 8 which are placed in the compartments 124 adjacent to each other. This is a requirement for holding a plurality of the packaged chips 8 firmly in position in one carrier module 100.

A distance between the adjacent partitions 122 may be adjusted to accommodate different-size packaged chips.

The base plate 120 has a plurality of contact holes 126. Terminals (not shown) of the packaged chip 8 are seen through each of the contact holes 126. Through the contact hole 126, the terminals of the packaged chip 8 are exposed to contact with sockets of a test board (not shown) to test the packaged chip 8

One or more inside walls 112, intersecting the partitions 122, are provided to the base module 120. This is done to place the packaged chips in two or more rows.

As shown in FIG. 3, for example, the base plate 120 has eight compartments 124 in two rows with the inside wall 112 in between.

The number of the compartments 124 may be adjusted depending upon the size of the base plate 120 and the numbers of the partition 122 and the inside wall 112.

The latch 140, which holds the packaged chip 8 in position in the compartments 124, is provided to the body 110.

The latch 140 includes a first latch 141, provided to an outside wall of the body, and a second latch 143, provided to the inside wall 112.

The first and second latches 141 and 143 includes first bars 141*a* and 143*a* and second bars 141*b* and 143*b*, respectively. The first bars 141*a* and 143*a* are rotatably connected to the body 110. The second bars 141*b* and 143*b* are pressed against the upper surfaces of the packaged chips 8.

The second bar 141*b* is pressed against one row of the packaged chips. The second bar according to the present invention is shaped in the shape of a thin plate, but not limited to this.

An elastic member 130 is seated between the body 110 and the latch 140 to press the latch 140 against the surface of the packaged chip 8. The elastic member 130 includes a torsion spring returning the latch 140 to its original position. That is, the elastic member 130 applies a returning force to the latch 140 in the direction opposite to the direction in which the latch is rotated The elastic member 130 includes whatever can apply the returning force to the latch 140 in the direction opposite to the direction in which the latch is rotated.

The outside wall of the body has a long hollow 114 where the latch 140 is accommodated when the latch 140 is rotated to place the packaged chip in the compartment.

As shown in FIG. 4, a driving unit 200 pushes the first latch 141 into the long hollow 114. At this point, the elastic member applies the returning force to the first latch 141 which is erected from the base plate 120.

After the packaged chips are placed in the compartment 124, the driving unit 200 stops pushing the first latch 141. Then the first latch 141 is pressed against the upper surface of the packaged chip 8 by a virtue of the returning force of the elastic member 130. Thus, the packaged chip 8 are held in position in the compartment 124. The driving unit may be pushing pins.

As shown in FIG. 5, as an example, eight packaged chips are placed in eight compartments 124 formed in two rows A and B.

The first latch 141 is pressed downwards against one end portion of each of the packaged chips placed in a single row A. The second latch 143 is pressed downwards against the other end portion of each of the packaged chips placed in a single row A. Thus, the packaged chips are firmly in position in the compartment 124 in a single row.

That is, it is made possible to hold the single row of the packaged chips firmly in position in the compartments 124 by pressing the latch against both end portions of each of the packaged chips placed in a single row.

Figure 6:
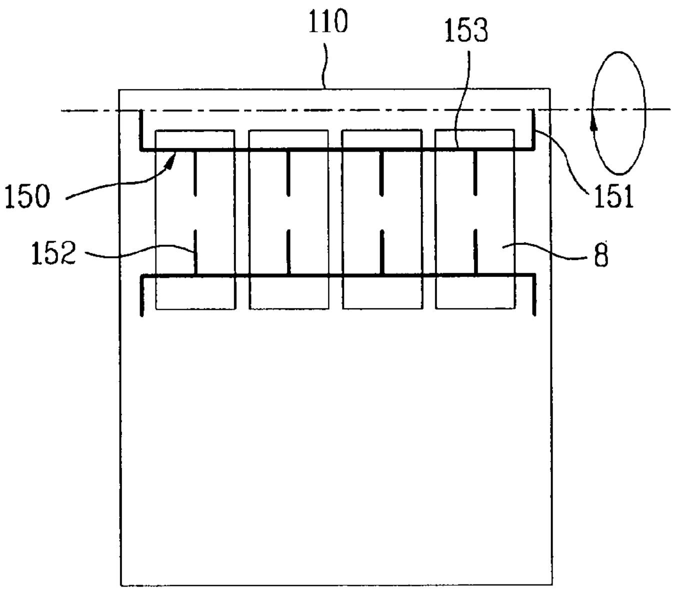
FIG. 6 is a plane view illustrating a carrier module for use in a handler for handling a packaged chip for a test according a second embodiment of the present invention.

FIG. 6 is a plane view illustrating a carrier module for use in a handler for handling a packaged chip for a test according a second embodiment of the present invention.

In the second embodiment, a latch 150 includes third bars 152, in addition to the first and second bars as in the first embodiment.

The latch 150 includes a body 110, a first bar 151 rotatably connected to the body 110, a second bar 153 pressed against the upper surface of the packaged chip, and the third bars 152 protruding from the second bar 153, each being pressed against the upper surface of the packaged chip.

The third bar 152 serves to help hold the packaged chips more firmly in position.

Figure 7:
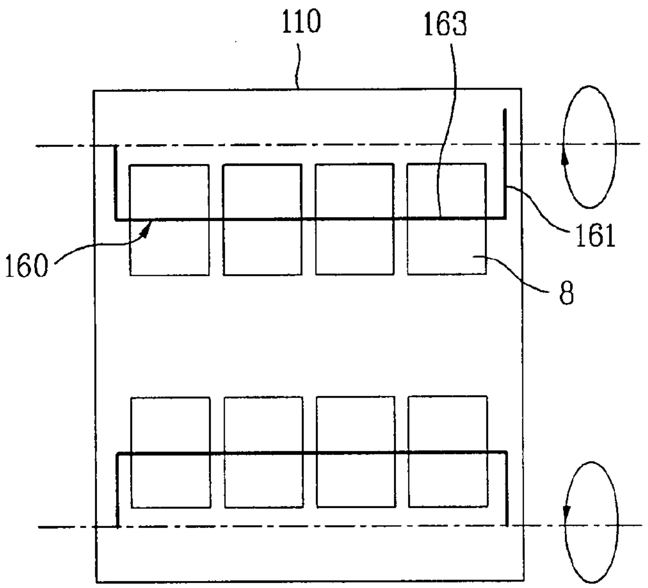
FIG. 7 is a plane view illustrating a carrier module for use in a handler for handling a packaged chip for a test according a third embodiment of the present invention.

FIG. 7 is a plane view illustrating a carrier module for use in a handler for handling a packaged chip for a test according a third embodiment of the present invention.

In the third embodiment, one latch is pressed downwards against a single row of the packaged chips. The latch includes a first bar 161 rotatably provided to a body, a second bar 163 connected to the first bar 161.

The second bar 163 may be pressed downwards against the middle of each of the packaged chips. This is to evenly distribute a pressing force over the surface of the packaged chip.

Figure 8:
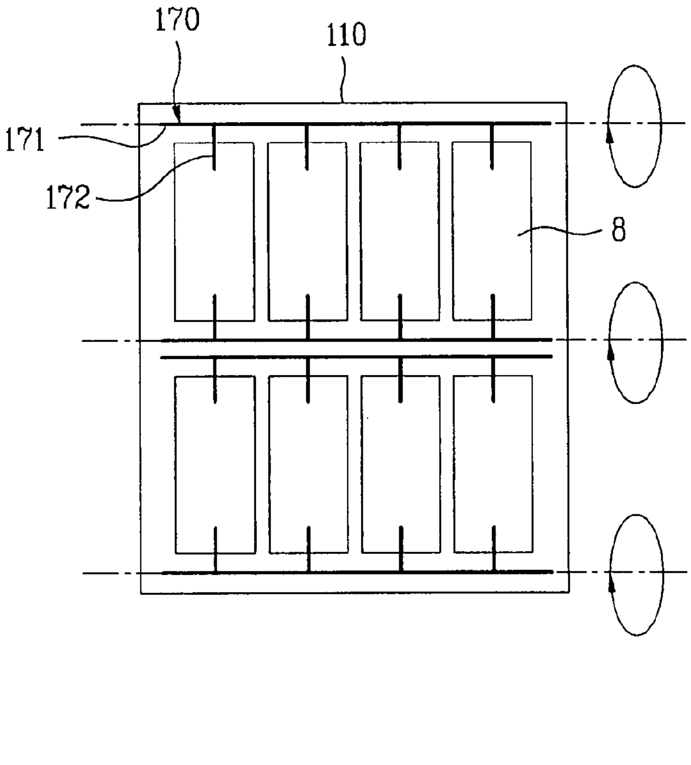
FIG. 8 is a plane view illustrating a carrier module for use in a handler for handling a packaged chip for a test according a fourth embodiment of the present invention.

FIG. 8 is a plane view illustrating a carrier module for use in a handler for handling a packaged chip for a test according a fourth embodiment of the present invention.

A latch 170 includes a first bar 171, and third bars 172 protruding from the first bar to be pressed against the end portion of the surface of the packaged chip.

The third bars 172, each of which protrudes from the first bar, are spaced and arranged relative to each other.

An elastic member is seated between one end of the first bar and the body. and between the other end of the first bar and the body. The elastic member provides a returning force to the latch 170. The third bar is pressed downwards against the end portion of the surface of the packaged chip by virtue of the returning force of the elastic member.

Figure 9:
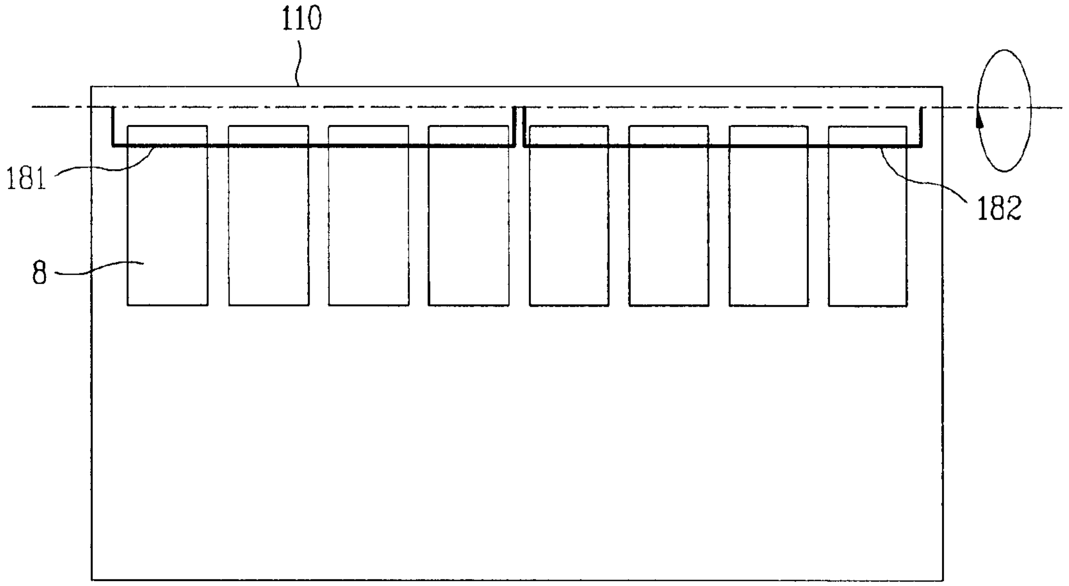
FIG. 9 is a plane view illustrating a carrier module for use in a handler for handling a packaged chip for a test according a fifth embodiment of the present invention.

FIG. 9 is a plane view illustrating a carrier module for use in a handler for handling a packaged chip for a test according a fifth embodiment of the present invention.

In the fifth embodiment, two or more latches 181 and 182 are employed in holding a single row of packaged chips firmly in place in compartments That is, two or more latches 181 and 182 are pressed downwards against the packaged chips placed in the compartments formed in a single row.

The number of the latches may be increased depending upon the number of the packaged chips placed in a single row.

The driving unit may rotate clockwise or counterclockwise the latch to move the latch into a long hollow provided on the outside wall of the body.

A handler for handling packaged chips for an electric test and sort them according to a test result includes the above-described carrier module and driving unit.

Operation of the carrier module 100 with the above-described configuration is now described.

When the compartment is empty, the latch 140 stays in contact with the base plate by virtue of the returning force of the elastic member.

Before the packaged chip is placed in the compartment, the driving unit 200 pushes the latch 140 upwards into the long hollow 114 of the outside wall of the body.

After the packaged chips are placed in the compartments formed in a row, the driving unit pushes the latch 140. Then the latch is pressed downwards against the surface of each of the packaged chips. Thus, the packaged chips 8 are held firmly in position in the compartments on the carrier module 100.

Thereafter, the test tray equipped with carrier modules 100 is transferred to a test site to perform the test on the packaged chips.

The present invention provides an advantage of the packaged chips being held firmly in place in a single carrier module.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A carrier module comprising:

a body;

a base plate, in which a plurality of packaged chips are placed in substantially a same direction, provided to the body, and at least one latch having a first bar which is commonly disposed across and in contact with surfaces of at least two adjacent packaged chips to hold the packaged chips in position on the base plate, wherein the first bar of the latch has a linear section which extends across and in contact with the surfaces of the at least two adjacent packaged chips to hold the at least two adjacent packaged chips in position on the base plate at a same time, and wherein the linear section which contacts the surfaces of the at least two adjacent packaged chips extends substantially in a same plane parallel to surfaces of the at least two adjacent packaged chips; and wherein the first bar includes a plurality of additional sections spaced from one another, each additional section extending from the first bar to contact respective ones of the at least two adjacent packaged chips, the additional sections providing additional forces for holding the at least two adjacent packaged chips in position on the base plate.

2. The carrier module according to claim 1, wherein a plurality of compartments are formed on an upper surface of the base plate, each compartment including a respective one of the packaged chips.

3. The carrier module according to claim 2, further comprising at least one partition provided to the upper surface of the base plate to form at least two of the plurality of compartments on the base plate.

4. The carrier module according to claim 3, wherein a width of the partition is at least substantially same as a distance between the packaged chips in the at least two compartments.

5. The carrier module according to claim 2, wherein the compartments are formed in one or more rows on the upper surface of the base plate.

6. The carrier module according to claim 5, wherein one or more inside walls, intersecting partitions separating adjacent ones of the compartments, are provided to the body to allow the packaged chips to be arranged in two or more rows, each row located on a different side of the one or more inside walls.

7. The carrier module according to claim 6, wherein the at least one latch comprises a first latch, provided to an outside wall of the body, and a second latch, provided to the inside wall of the body.

8. The carrier module according to claim 7, wherein the first and second latches cooperate to hold a row of the packaged chips in position in respective ones of the compartments by being pressed against surfaces of the packaged chips.

9. The carrier module according to claim 1, wherein the first bar of the latch is pressed against upper surfaces of respective ones of the packaged chips to simultaneously hold the packaged chips in position and wherein a second bar of the latch is rotatably coupled to the body.

10. The carrier module according to claim 9, wherein the first bar is pressed against centers of upper surfaces of the packaged chips in a width direction of the packaged chips.

11. The carrier module according to claim 1, wherein two or more latches are employed to hold a single row of the packaged chips in position.

12. The carrier module according to claim 1, further comprising: an elastic member provided between the body and the latch, providing a returning force to be applied to upper surfaces of one or more of the packaged chips.

13. The carrier module according to claim 4, wherein the elastic member comprises a torsion spring providing the returning force toward the base plate.

14. The carrier module according to claim 4, wherein a long hollow space, where the latch rotated by being pushed is accommodated, is formed on outside wall of the body.

15. The carrier module for a test according to claim 1, wherein at least one contact hole to expose a certain portion of one of the packaged chips is formed on the base plate.

16. The carrier module according to claim 1, further comprising:

a driver to rotate clockwise or counterclockwise the latch, to move the latch into a long hollow space provided on an outside wall of the body.

17. The carrier module according to claim 1, wherein the latch comprises an elastic member for providing a returning force by which the latch is pressed against upper surfaces of the packaged chips.

18. The carrier module according to claim 7, wherein the first bar and a second bar are commonly disposed across and in contact with surfaces of the packaged chips to simultaneously hold the packaged chips in position on the base plate, the first and second bars extending in directions that are substantially parallel to one another.

19. The carrier module according to claim 1, wherein each additional section extends from the first bar at substantially a same angle in a same direction.

20. The carrier module according to claim 19, wherein said same angle is 90°.

21. The carrier module according to claim 1, wherein the additional sections are equally spaced from one another.

* * * * *